United States Patent [19]

Crowe

[11] Patent Number: 4,667,296
[45] Date of Patent: May 19, 1987

[54] TESTING THE TRANSFER FUNCTION LINEARITY OF ANALOGUE INPUT CIRCUITS

[75] Inventor: Alan S. Crowe, South Queens Ferry, Scotland

[73] Assignee: Ferranti plc, Cheshire, England

[21] Appl. No.: 643,416

[22] Filed: Aug. 23, 1984

[30] Foreign Application Priority Data

Aug. 24, 1983 [GB] United Kingdom ............... 8322803

[51] Int. Cl.⁴ .................. G06F 15/20; G01R 31/28
[52] U.S. Cl. ................... 364/553; 340/347 CC; 371/25
[58] Field of Search ........... 364/553; 340/347 AD, 340/347 CC; 371/25

[56] References Cited

U.S. PATENT DOCUMENTS

| | | | |
|---|---|---|---|
| 3,586,846 | 6/1971 | Ley | 364/553 |
| 3,643,073 | 2/1972 | Sawamura | 364/553 |
| 3,973,112 | 8/1976 | Sloane | 364/553 |
| 4,122,529 | 10/1978 | Hoech | 364/553 X |
| 4,328,552 | 5/1982 | Stovall | 364/553 X |
| 4,352,160 | 9/1982 | Frech | 364/553 |
| 4,354,177 | 10/1982 | Sloane | 364/553 X |
| 4,375,692 | 3/1983 | Shensa et al. | 364/553 X |
| 4,397,029 | 8/1983 | Satorius et al. | 364/553 X |

Primary Examiner—Felix D. Gruber
Assistant Examiner—Kevin J. Teska
Attorney, Agent, or Firm—Kerkam, Stowell, Kondracki & Clarke

[57] ABSTRACT

Testing the transfer function linearity of analogue input circuits. The transfer function linearity of an analogue input circuit, such as an analogue-to-digital converter (ADC) 25 is tested by generating two consistently reproducible digital test signals (5), converting the digital test signals to analogue form (7) and forming a combination test signal as the average of the two 'simple' test signals (16). On three successive occasions the digital test signals are generated and on each occasion a different one of the analogue signals is applied to the ADC under test and the digitized signals stored. A digital combination signal is formed by sampling the digitized 'simple' signals and taking the average of the signals, the digital combination and digitized combination signals being subtracted for each sample and any discrepancies summed. The summed total after all the sample points comprising the test signal have been taken gives a measure of any non-linearity of the ADC. The two digital test signals should preferably have no relationship between them and are generated as pseudo-random binary sequences or stored in a ROM.

16 Claims, 1 Drawing Figure

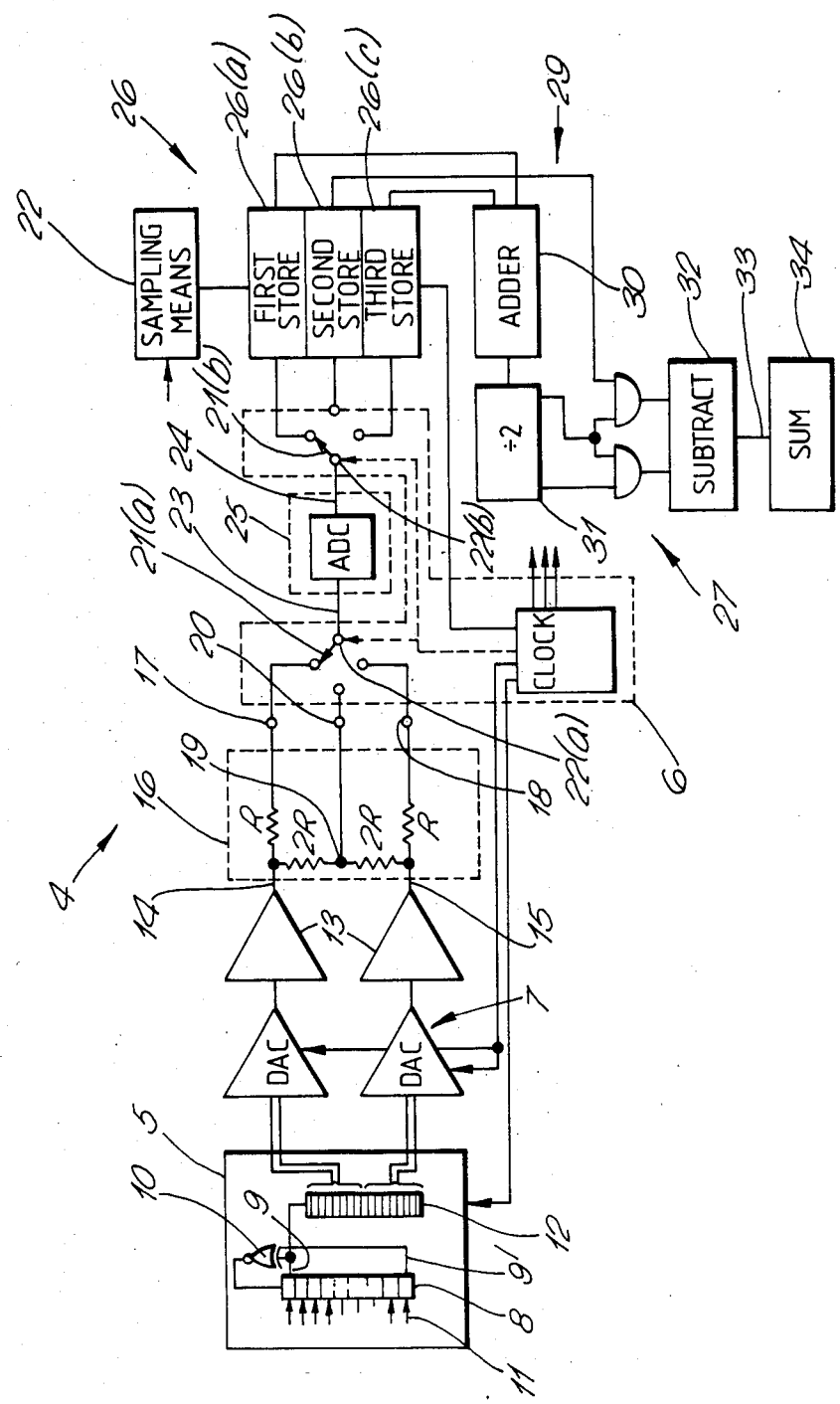

TESTING THE TRANSFER FUNCTION LINEARITY OF ANALOGUE INPUT CIRCUITS

This invention relates to the testing of the linearity of the transfer function of analogue input circuits and particularly, but not exclusively, to testing the linearity of the transfer function of analogue-to-digital converters (ADC's).

Hitherto it has been known to examine the transfer function of an ADC by applying thereto signals generally of sinusoidal form. One method involves digitising a sinusoid of great purity and Fourier transforming the resultant data. Deficiencies of the ADC appear as harmonics of the input signal. However, deficiencies of the test signal also appear as harmonics and limit the sensitivity of the test. An alternative method of processing such a digitised signal is by a least squares fit to a sinewave parameterised for frequency, amplitude, phase and DC offset, ADC deficiencies appearing as a residual sum of squares error. Such residual sum can also be caused by errors in the test signal and so the test sensitivity is also limited.

Other tests involving the accurate generation of a pure sinusoid are the so-called two tone test, histogram test and beat frequency test.

A further test, involving white noise, comprises making a 'hole' in the noise spectrum with a deep narrow notch filter. The test signal is digitised and Fourier transformed, deficiencies in the ADC causing the hole to be 'filled'.

These tests are described more fully in Hewlett Packard Applications Note 5180A-2. Although such tests differ in detail they all depend for accuracy on the quality of the input signal. While it is impossible to produce a test signal waveform with absolutely no distortion or noise, even to approach the quality requisite for testing high performance ADC's is difficult and costly. Furthermore the processing of the digital data in the above mentioned tests frequently requires complex apparatus to perform Fourier transforms and the like, adding further to the cost of such testing and whereas a measure of linearity may be obtainable in response to the particular test waveforms there is no certainty that the ADC in use will respond equally linearly to other signal waveforms that might be encountered.

The same problem exists with other analogue input circuits, such as active filters.

It is an object of the present invention to provide a method of testing the linearity of the transfer function of an analogue input circuit and apparatus for testing the linearity of the transfer function of an analogue input circuit, which mitigates problems and disadvantages of known methods and apparatus.

A technique is known for monitoring the production of digital signals from a plurality of analogue signals by means of an ADC and is described in UK patent specification No. 2034547. The arrangement described comprises tapping three analogue power line signals, applying them to a multiplexer, thence to an ADC from which the digitised data is fed to digital processing means for demultiplexing and processing. As a check of the correct functioning of the multiplexer and ADC two check signals are employed. One is derived by summing the analog input signals to provide a combination signal which forms a fourth signal applied by way of the multiplexer to the ADC. The digitised value of this signal is stored and a similar combination formed of the digitised input signals. The two combination signals are compared to establish, by non-equality, a fault in the multiplexer or ADC. Such a comparison could however indicate equality when the ADC is completely inoperative and none of the signals pass and to obviate this a second, known, check signal is passed through the multiplexer and ADC the digitised data being compared with the correct value stored in the monitor.

The technique employed in the above described specification, namely, the digitisation of both 'simple' signals and a 'combination' signal and the comparison of the digitised combination signal with a combination of the digitised 'simple' signals, may form the basis of evaluating the linearity of the transfer function of an analogue input circuit, such as an ADC, or an analogue circuit in tandem with an ADC.

According to a first aspect of the present invention apparatus for testing the linearity of the transfer function of an analogue input circuit comprises connection means operable to apply an analogue signal to, and receive a digitised form thereof from, an analogue input circuit, including an analogue to digital converter, under test by the apparatus, digital test signal generating means operable to generate a plurality of test signals in digital form, digital to analogue conversion means operable to convert said signals simultaneously into analogue test signals of predetermined duration, analogue processing means responsive to said analogue test signals to provide from a predetermined combination of said signals a combination test signal, storage means arranged to receive from the connection means and store each of the test signals of the predetermined duration digitised, timing means operable to cause the digital test signals to be generated repetitively, the resultant analogue and combination test signals to be applied sequentially to the connection means and the digitised test signals to be applied to the storage means and digital processing means including sampling means operable to define a plurality of sampling points of the stored signals and for each point in turn take samples from corresponding points of all of the digitally stored signals, combination means operable to define from the digitised test signal samples in said predetermined combination a digital combination signal and differencing means operable to determine at each sample point a difference in magnitude between the digitised combination test signal and the digital combination signal, and summation means operable to sum the magnitude differences determined by the differencing means for each of the sampling points to provide an indication, by the sum, of the departure from linearity of the transfer function of the ADC.

According to a second aspect of the present invention a method of evaluating a level of non-linearity in the transfer function of an analogue input circuit, including an analogue-to-digital converter (ADC), comprises generating a plurality of digital test signals of predetermined duration, converting them to analogue form, processing the analogue test signals to produce from a predetermined combination thereof a combination test signal, feeding the analogue test and combination test signals to the ADC one at a time, storing the digitised form of each signal, sampling the stored signals at corresponding ones of a plurality of points thereof, defining at each sample point a digital combiantion signal from said predetermined combination of the digitised test signals determining the difference in magnitude between the digitised combination test signal, and the digital combination signal and summing the difference values obtained for each of the sample points.

An embodiment of the present invention will now be described by way of example with reference to the accompanying drawings, in which the single FIGURE is a block diagram of testing apparatus according to the present invention, including an ADC to be tested in position in the circuit.

Referring to the FIGURE the apparatus 4 of the present invention comprises digital test signal generating means 5, for instance, a pseudo-random binary sequence (PSBS) generator controlled by timing means 6 producing two unrelated digital output signals which are applied to digital to analogue conversion (DAC) means 7 in order to form two simultaneously generated analogue signals P and Q. The PSBS generator is of known form and does not require a detailed description, essentially comprising a shift register 8 whose first and last stages 9, 9' are coupled by way of an exclusive NOR gate 10 to a serial input of the register, and a plurality of parallel inputs 11 connected to the stages of the shift register 8 by which initialisation values are repeatedly loaded into the shift register. The first stage output 9 is also connected to serial input terminal of a sixteen-bit serial in, parallel out, shift register 12 which, each time the shift registers are clocked sixteen times, produces two eight-bit words as the digital output signals to the DAC means 7.

The separate outputs of the DAC means are connected by buffer amplifiers 13 to two inputs 14, 15 of analogue processing means 16. The analogue processing means 16 comprises a resistive combiner having the aforementioned inputs 14, 15 each connected to a respective output 17, 18 by a resistor of value R ohms and to each other by way of two serially connected resistors each of value 2 R ohms, the junction point 19 of the resistors being connected to a third output 20. As the test signals are generated the 'simple' test signals are produced in analogue form at outputs 17 and 18 and a combination test signal, the average of the two simple test signals, is produced at output 20 as $M=(P+Q)/2$.

The timing means 6 also includes switching means shown schematically as ganged three-position switches 21(a) and 21(b), the common, or movable, contacts 22(a) and 22(b) of the switches being connected to input and output terminals 23, 24 respectively of connection means 25.

The connection means 25 comprises a connection pad arranged to support an ADC to be tested and provide it with suitable supply voltages and clock signals as well as coupling it to receive an analog input signal from input terminal 23 and provide a digital output signal to output terminal 24.

The three fixed terminals of switch 22(a) are connected individually to the outputs 17, 18 and 20 of the analogue processing means and the three fixed terminals of the switch 22(b) are connected individually to inputs of storage means 26, shown as three separate stores 26(a), 26(b) and 26(c), each capable of holding the digitised form of an analogue test signal applied to the ADC under test.

The connections between the analogue processing means and the switching means is such that the outputs 17, 18 and 20 are connected to a load impedance equal to that of the input to the ADC when not selected by the switching means. This may be achieved by dummy loads (not shown) or by using other ADC's to be tested.

In operation, with the test ADC in the connection means the timing means 6 controls the switches 21(a) and 21(b) such that the terminal 17 of the analogue processing means is connected to the input of the ADC and the ADC output is connected to the first store 26(a). The timing means causes the stored test signals to be generated by the generating means 5 where they are converted to analogue form and processed by the analogue processing means. One of the test signals (P) produced at 17 is digitised and the digitised form (P') stored in the first store 26(a). The timing means then operates switches 21(a) and (b) together so that the analogue processing means output 18 is connected to the input of the ADC output the ADC output to third store 26(c), the generating means 5 being triggered again to reproduce the pseudo-random sequences which form the two analogue test signals applied to the analogue processing means. This time it is the other test signal (Q) applied to the ADC and the digitised form (Q') stored in store 26(c).

The timing means then moves the switching means 21(a), 21(b) to the third (intermediate) position to receive signals from analogue processing means output 20 and triggers the generating means 5 yet again to produce the sequence forming analogue test signals P and Q. The combination (average) signal M appearing at output terminal 20 is digitised and the digitised combination signal (M') stored in the second store 26(b).

Thus in order to produce the stored digitised signals requires the production of the analogue test signals on three occasions. The accuracy of the test depends upon the repeatability of the test signals rather than onthe particular form of either signal and the generation of the signals from a readily reproducible digital sequence rather than in an analogue function generator provides such repeatability.

Timing means 6 also controls the operation of a digital processing means 27 that comprises sampling means 28 which is arranged to address the three stores and read therefrom samples of the digital signals associated with corresponding points of the test signals, with respect to the time from the beginning of the test signal.

The samples from the first and second store 26(a) and 26(b) i.e. form the simple test signals. P' and Q' are fed to combination means 29, consisting of addition means 30 and divide-by-two circuit 31. The circuit 31 is arranged such that the division only takes place if the sum (P'+Q') is even, that is, the signals are ignored if the sum is odd. The manner in which the combination means operates is open to variation but conveniently may include gating means to establish that the least significant bit (l.s.b.) of the sum word is '0' and then to shift the word bits one order lower to effect division. Because the division is only carried out with an even number, the division is accurate i.e. there is no error over any 'lost' l.s.b. as could occur if it were a '1'.

The digital combination signal, i.e. (P'+Q')/2 is applied to differencingmeans 32 with the sample obtained from the third store corresponding to the digitised combination test signal i.e. [(P+Q)/2]' and any difference between them manifested as an output at terminal 33, the magnitude of the difference being an indication of the degree of departure from linearity for that sample point.

The output terminal is connected to supply the difference signals to summation means 34.

The digital processing means operates by taking samples from a large number (say 1000) of store locations containing the digitised signals and representing sampling points.

It will be appreciated that if the comparison between the digital combination signal and digitised combination signal does not show equality then a non-linearity of the ADC is indicated, at least at that sample point in the test signals, and a signal having a magnitude related to the difference entered to the summation means. By repeating this for each of the sample points and summing the signals attributable to erroneous points, the total of the summation gives a measure of the non-linearity of the ADC over the whole spectrum of the test signals.

If desired the sample points at which errors are produced may be recorded separately to show, for instance, the distribution of non-linearity throughout the response spectrum of the amplifier.

As stated, the form taken by the test signals are not limited to the usual sinusoid which can be generated repeatedly with a reasonable degree of accuracy but by generation from the digital form may take a form more closely resembling the waveform expected to be applied to the ADC in the use for which it is being tested. In practice a pseudo-random noise waveform as represented by a pseudo-random binary sequence contains all of the components likely to be met in practice from any analogue input signal and provides a comprehensive test of the ADC.

The test sequence should be of such a duration that any statistical fluctuations which may occur from ADC to ADC will be minimised.

The ratio of analogue signals chosen for the embodiment described is their average i.e. the two resistor branches of the analogue processing means are each 2R. If desired an ADC of known performance may be used and the ratios varied until a minimum error obtained, this setting then being employed in the particular test arrangement. Alternatively any other ratio between the signals may be employed, although the average is particularly convenient and by taking an average only when the signal sum is even there is no problem with division 'remainders' appearing as quantisation errors in the digital samples.

Without departing from the scope of the invention other elements may take different form. The digital generating means may comprise pseudo-random binary sequence generator of different construction, for example using a separate shift register for the generation of each test signal bit, enabling higher sampling rates to be obtained. Alternatively the digital generating means may comprise a store, such as a ROM in which data representing suitable waveforms is stored in successive locations addressed by a counter and read out by way of a register under the control of the timing means. The stored data may represent random sequences described in the embodiment above or contain digital representations, e.g. recordings, of typical input waveforms, the only requirement being that the generating means maintains synchronism with the timing means and produces on each occasion the same signals.

Furthermore the digital processing means described above with reference to functional circuit elements may comprise a microprocessor having fixed in the storage medium thereof the instruction sequences necessary to sample and operate on the stored digitised test signals as described. The storage means 26 is preferbly separate from microprocessor control enabling the test signals to be digitised at high frequency by the ADC. The stored data may however be sampled and processed by the microprocessor.

The analogue outputs of the DAC's may be filtered to reduce the bandwidth of the signals applied to the analogue processing means and thus the ADC under test if it is designed to operate with a limited bandwidth. In the circuit arrangements described above the DAC's are followed by buffer amplifiers 13. If within a frequency range of interest the impedance of the combiner network and output impedance of the DAC's results in minimal cross-coupling between the test signals the buffers 13 may be omitted.

It is of particular importance that within the timing means the switch 21(a) does not introduce any non-linearity of the signal and to this end is preferably of mechanical nature such as that described above, or the equivalent plug and socket arrangement. However the switching may be performed electronically if desired, the linearity performance of the switch then becoming a limiting factor on the accuracy of the circuit.

The function of switch 21(b) is, on the other hand, preferably performed electronically, such as by AND gates opened by suitable signals from the timing means.

Although the above description has related to the testing of an ADC it will be appreciated that the arrangement may be used equally with an analogue circuit which includes an ADC of known high linearity, such as an active filter circut feeding into a suitably tested ADC. The ADC will not in general be part of the circuit but forms part of the analogue-input circuit for the purposes of connection to the connection means and performance of the test.

What is claimed is:

1. Apparatus for testing the linearity of the transfer function of an analogue input circuit under test which includes an analogue to digital converter, comprising:

connection means for applying an analogue signal to, and for receiving a digitised signal from, the analogue input circuit;

digital test signal generating means for generating a plurality of test signals in digital form;

digital to analogue conversion means for converting said digital test signals simultaneously into analogue test signals of predetermined duration;

analogue processing means responsive to said analogue test signals for providing from a predetermined combination of said analogue test signals a combination test signal;

storage means for receiving from the input circuit and for storing digitised output signals corresponding to each of said analogue test signals and said combination test signal;

timing means for causing the digital test signals to be generated repetitively, for causing the analogue and combination test signals to be applied sequentially to the connection means, and for causing the digitised output signals to be applied to the storage means;

digital processing means including sampling means for sampling at a plurality of corresponding points each of the stored digitised output signals combination means for combining the digitised output signal samples corresponding to said analogue test signals in said predetermined combination to form a digital combination signal;

differencing means for determining at each sample point a difference in magnitude between the digitised combination test signal and the digital combination signal; and summation means for summing the magnitude differences determined by the differencing means for each of the sampling points to provide an indication of the departure from linearity of the transfer function.

2. Apparatus as claimed in claim 1 in which the digital test signal generating means produces two digital test signals.

3. Apparatus as claimed in claim 2 in which the analogue processing means comprises a resistive combiner having three outputs and is operable to produce at respective ones of said outputs two said analogue test signals corresponding to said two digital test signals and said combination test signal comprising an average of the two analogue test signals.

4. Apparatus as claimed in claim 1 in which the digital test signal generating means comprises a pseudo-random binary sequence generator operable to generate said plurality of digital test signals.

5. Apparatus as claimed in claim 1 in which the digital processing means comprises a microprocessor having a storage medium for storing instruction sequences necessary to sample and operate on the stored digitised signals.

6. A method of evaluating a level of non-linearity in the transfer function of an analogue input circuit which includes an analogue-to-digital converter (ADC), comprising generating a plurality of digital test signals of predetermined duration, converting the digital test signals to analogue test signals, processing the analogue test signals to produce from a predetermined combination thereof a combination test signal, feeding the analogue test and the combination test signals to the input circuit one at a time, storing digitised forms of each signal from the ADC, sampling the stored signals at corresponding ones of a plurality of points thereof, defining at each sample point a digital combination signal by combining in said predetermined combination samples of the digitised test signals, determining the difference in magnitude between the digitised combination test signal and the digital combination signal, and summing the difference values obtained for each of the sample points.

7. A method as claimed in claim 6, wherein said generating comprises generating the digital test signals as pseudo-random binary sequences.

8. A method as claimed in claim 7, wherein said generating comprises generating digital test signals which are substantially unrelated.

9. A method as claimed in claim 6, wherein said processing comprises producing said combination test signal as an average of the analogue test signals.

10. A method as claimed in claim 9, wherein there are two digitised analogue test signals which are summed to form the digital combination signal, and said determining comprises determining, for each sample point, that the sum is exactly divisible by two prior to determining said difference in magnitude between the digitised combination test signal and the digital combination signal.

11. A method as claimed in claim 6, wherein said generating comprises generating two digital test signals.

12. A method as claimed in claim 6 in which there are of the order of 1000 sample points.

13. A method as claimed in claim 6 in which the analogue test signals generated include signals of the form tht the input circuit may expect to receive in use.

14. Apparatus for testing an analogue circuit which includes an analogue to digital converter, comprising:
means for generating a plurality of digital test signals;
digital to analogue converter means for converting the plurality of digital test signals into a plurality of corresponding first analogue test signals;
means for combining in a predetermined manner the first analogue test signals to form a second analogue test signal;
means for applying the first and second analogue test signals sequentially to the analogue circuit;
means for receiving from the analogue circuit and for storing first and second digitised output signals corresponding, respectively, to the first and second analogue test signals;
means for sampling each of the stored first and second digitised output signals at a plurality of corresponding points of each signal;
means for combining in said predetermined manner samples of said first digitised output signals to form a resultant signal;
means for determining at each sample point the magnitude of any difference between the resultant signal and said second digitised output signal; and
means for summing the difference magnitudes for each of said sampling points to provide an indication of a non-linearity in said analogue circuit.

15. Apparatus accoring to claim 14, wherein said combining means comprises means for forming an average of first and second ones of said first analogue test signals.

16. Apparatus according to claim 15, wherein said determining means includes means for determining the magnitude of said difference only when a sum of the samples of first and second ones of said first digitised signals which are combined to for said resultant signal is divisible by two.

* * * * *

UNITED STATES PATENT AND TRADEMARK OFFICE
CERTIFICATE OF CORRECTION

PATENT NO. : 4,667,296

DATED : May 19, 1987

INVENTOR(S) : Crowe

It is certified that error appears in the above-identified patent and that said Letters Patent is hereby corrected as shown below:

Column 6, line 62, after "signals" insert --;--.
Column 7, line 27, after "digitised" insert --test--.
Column 8, line 17, delete "tht" insert --that--.
Column 8, line 45, "accoring" should be --according--.

Signed and Sealed this

Tenth Day of November, 1987

*Attest:*

DONALD J. QUIGG

*Attesting Officer*   *Commissioner of Patents and Trademarks*